(12) United States Patent
Schuster et al.

(10) Patent No.: US 7,191,513 B2
(45) Date of Patent: Mar. 20, 2007

(54) DEVICE FOR INSTALLATION OF A GRADIENT COIL UNIT INTO A MAGNETIC RESONANCE APPARATUS

(75) Inventors: Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/290,360

(22) Filed: Nov. 30, 2005

(65) Prior Publication Data

US 2006/0137177 A1 Jun. 29, 2006

(30) Foreign Application Priority Data

Nov. 30, 2004 (DE) .................. 10 2004 057 725

(51) Int. Cl.
*G01R 33/385* (2006.01)
(52) U.S. Cl. .............. 29/760; 29/281.1; 29/281.4; 29/606; 29/759; 324/318
(58) Field of Classification Search ............ 29/606, 29/602.1, 759, 760, 281.1, 281.4–281.6, 29/559, 56.6, 737; 269/8; 324/318–320
See application file for complete search history.

(56) References Cited

U.S. PATENT DOCUMENTS 1,195,147 A * 8/1916 Mitchell ............ 414/746.5
2,998,278 A * 8/1961 Daiuta et al. ............ 294/67.21
3,657,786 A * 4/1972 Wiswell, Jr. .................. 29/244
5,066,915 A * 11/1991 Omori et al. ................ 324/318
5,783,943 A * 7/1998 Mastandrea et al. ........ 324/318
2004/0158922 A1 8/2004 Eberler et al.
2004/0239326 A1* 12/2004 Kreischer .................... 324/318

FOREIGN PATENT DOCUMENTS

| DE | 119 297 | 4/1976 |
| EP | 362931 A2 * | 4/1990 |
| EP | 0 552 542 | 11/1992 |
| EP | 552542 A1 * | 7/1993 |
| WO | WO 8809927 A1 * | 12/1988 |

OTHER PUBLICATIONS

Coil Lifters, Aug. 14, 2003 http://web.archive.org/web/20030814154532/http://www.eltlift.com/c_hooks.html.*
Universal Joint, http://en.wikipedia.org/wiki/Image:Universal_joint.png.*

* cited by examiner

*Primary Examiner*—Peter Vo
*Assistant Examiner*—Livius R. Cazan
(74) *Attorney, Agent, or Firm*—Schiff Hardin LLP

(57) ABSTRACT

A device for installation of a gradient coil unit into a magnetic resonance apparatus has at least one support unit and at least one carrier unit. The carrier unit is fashioned to carry the gradient coil unit, and the at least one support unit is supported thereon such that it can tilt on a connector.

13 Claims, 2 Drawing Sheets

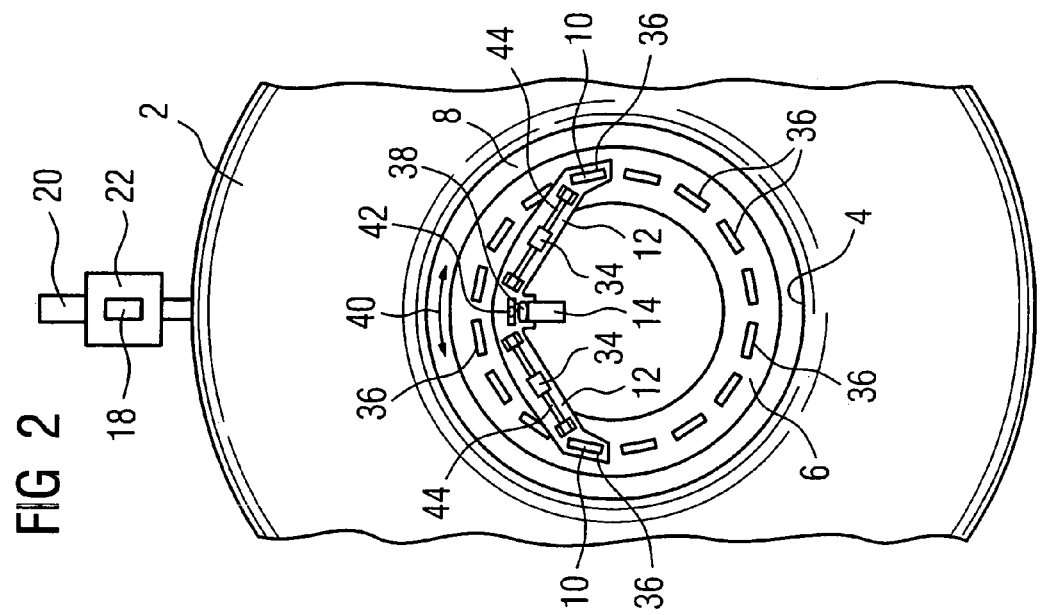
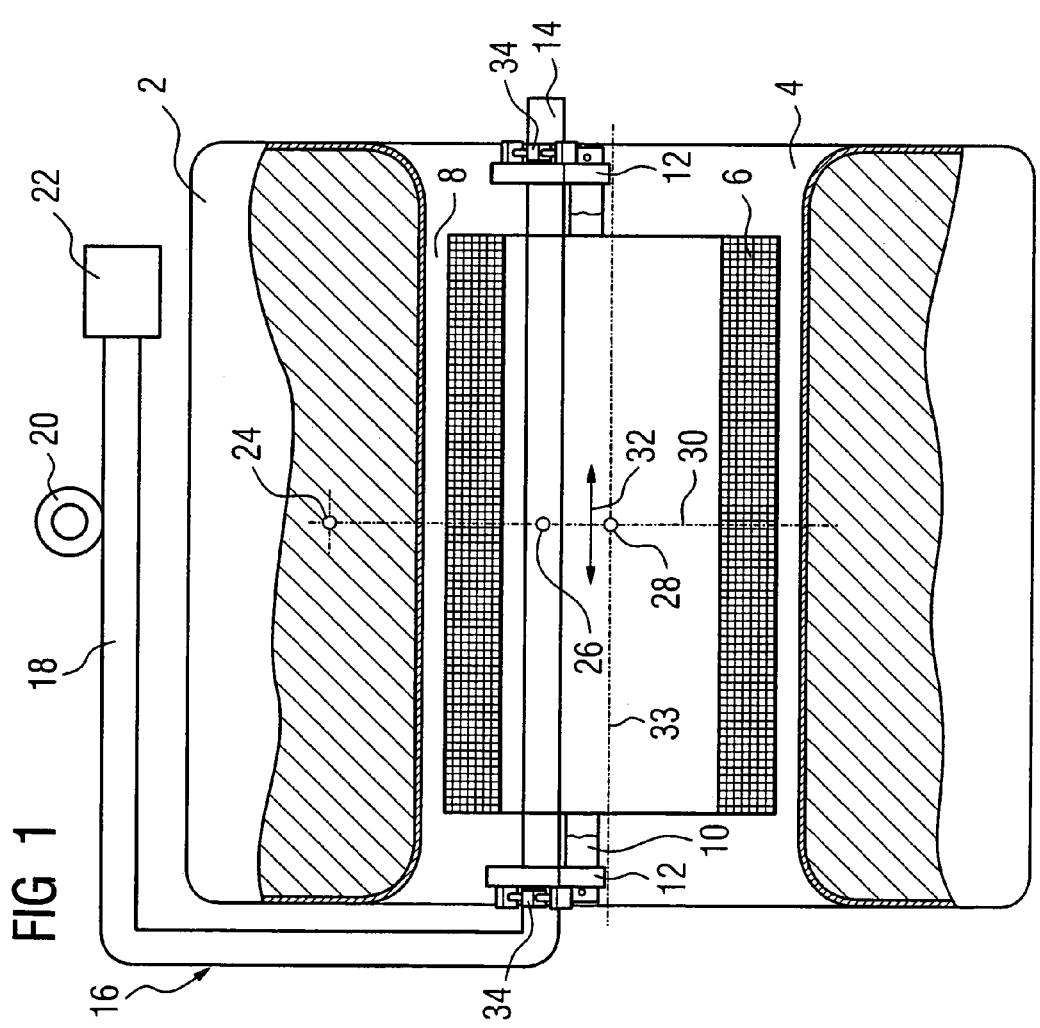

DEVICE FOR INSTALLATION OF A GRADIENT COIL UNIT INTO A MAGNETIC RESONANCE APPARATUS

BACKGROUND OF THE INVENTION

1. Field of the Invention

The present invention concerns a device for installation of a gradient coil unit into a magnetic resonance apparatus.

2. Description of the Prior Art

For the installation of heavier components of a medical apparatus, an auxiliary device is frequently required that assists the technician. The mass of a gradient coil unit of a magnetic resonance apparatus is generally more than 100 kilograms, such that installation thereof into the magnetic resonance apparatus is not possible without auxiliary means. In magnetic resonance apparatuses, the gradient coil unit is supported (mounted) within a basic field magnet. A gap thus exists between the basic field magnet and the gradient coil unit. This gap is only a few millimeters, while the diameter of the receptacle (retainer) for the gradient coil unit is several hundreds of millimeters. It is therefore necessary to exactly position the gradient coil unit. In particular the magnetic center of the gradient coil unit must be positioned at the magnetic center of the basic field magnet with a tolerance of approximately 1 mm. The axes of symmetry of basic field magnet and gradient coil unit must additionally be aligned counter to one another with a tolerance of 0.1°. Once the alignment of the gradient coil unit is achieved exactly, lining parts are installed into the gap with a positive fit and the gradient coil unit is fixed in this manner.

To install the gradient coil unit it is known to accommodate the gradient coil unit by means of a carrier device and to insert it into the basic field magnet. The alignment ensues by means of shims (wedges) arranged between the gradient coil unit and the basic field magnets. A rotation ensues utilizing gravity by means of shims that are not centrally mounted, so a tilting of the gradient coil unit is achieved. The described procedure is exceedingly time-consuming and laborious for the implementing technician.

A transport cart or carriage for a gradient coil unit is known from EP 0 552 542 A1. The transport cart is fashioned such that different types of gradient coil units can be transported therewith. Spacers can be introduced between the basic field magnet and the gradient coil unit to align the gradient coil unit within the basic field magnet.

A method and a device for horizontal mounting of liners in high-pressure tank construction is described in East German PS 119 297. A tube bundle is thereby supported on transport segments. To align the tube bundle within a high pressure jacket, the transport segments are supported on three-point supports that can be vertically adjusted at three points of the floor or base by means of leveling elements.

SUMMARY OF THE INVENTION

An object of the present invention is to provide a device for installation of a gradient coil unit into a magnetic resonance apparatus that allows installation and alignment of the gradient coil unit in a simple manner.

This object is achieved in accordance with the invention by a device having at least one support unit and at least one carrier unit that is designed to carry the gradient coil unit and on which the at least one support unit is carried such that it can be tilted via a connector. The support unit is brought into the receptacle (tunnel) of the magnetic resonance apparatus with the gradient coil unit and is aligned. In the installation of the gradient coil unit, it is positioned such that its magnetic center is in or at the magnetic center of the basic field magnet. By the use of a tiltable connector, it is possible in a simple manner to correct the tilt of the gradient coil unit with regard to its axis of symmetry. This avoids the conventional protracted adjustment event with shims within the basic field magnet.

In an embodiment, the at least one carrier unit can be tilted relative to an axis that is parallel to a longitudinal axis of the support unit. This enables a simple alignment of the gradient coil unit with regard to this longitudinal axis. This adjustment event is particularly important for a gradient coil unit built in a cylindrical shape, as is common.

One possibility for correcting a non-ideally-aligned gradient coil unit is the use of weight elements that are mounted on the carrier unit such that they can be moved and secured. By moving the weight elements the technician can effect an optimization of the angle position of the gradient coil unit in a simple manner.

In another embodiment, the carrier unit has a position monitoring unit. The correct (in terms of angle) position for a technician can be directly detected with this position monitoring unit.

The at least one support unit has a support segment with a support surface (contact surface) for movable support of the connector. For example, the position of the gradient coil unit can be optimized in a simple manner within the basic field magnet, and the magnetic center of the gradient coil unit thus can be positioned in the magnetic center of the basic field magnet.

In a preferred embodiment of the invention, the connector exhibits a tapering at both ends with regard to an axis lying perpendicular to the cross-section. The support surface is planar. Due to the use of barrel-shaped roller, the gradient coil unit (connected, for example, with the carrier unit) automatically aligns within the basic field magnet by gravity. The gradient coil unit thus can be tilted on its axis of symmetry in a limited range, such that the correct (with regard to the angle) position can be adjusted in a simple manner. In this manner, only a little work still needs to be conducted for the alignment of the gradient coil unit. In particular iterative alignments by means of shims is avoided.

DESCRIPTION OF THE DRAWINGS

FIG. 1 is a longitudinal section through a magnetic resonance apparatus showing the installation of a gradient coil unit in accordance with the invention.

FIG. 2 is an end sectional view of the magnetic resonance apparatus of FIG. 1.

DESCRIPTION OF THE PREFERRED EMBODIMENTS

Figure 3:
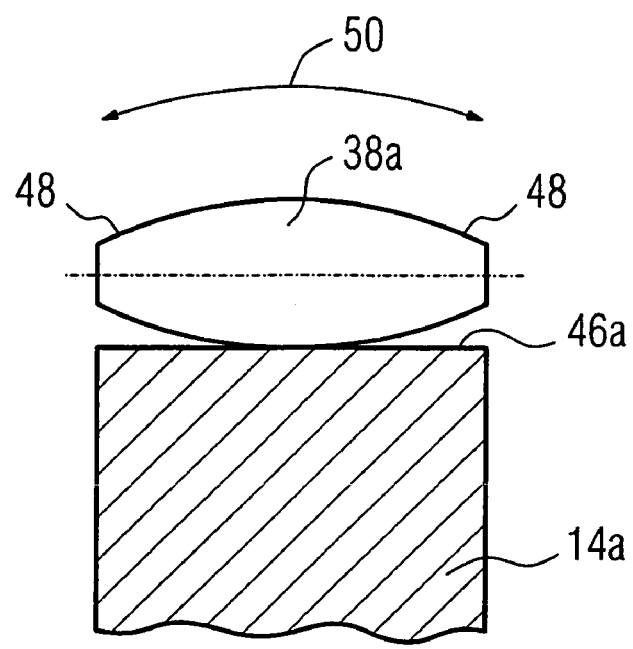
FIG. 3 shows an embodiment of a roller (caster) and a support bar in accordance with the invention.

As shown in FIG. 1, a magnetic resonance apparatus has a basic field magnet 2 with a tubular longitudinal opening 4. A gradient coil unit 6 is installed into the opening 4. For a better overview, the resulting gap 8 between the gradient coil unit 6 and the basic field magnet 2 is shown over-proportionally large in comparison with the size of the basic field magnet 2. The gradient coil unit 6 is connected via metal carriers 10 with two carrier units 12 that are supported on a support bar or rail 14 such that they can move along it. The support bar 14 traverses the gradient coil unit 6 and is larger in terms of length than the basic field magnet 2. The support bar 14 is part of a C-shaped support unit 16. The support unit 16 has a load arm 18 with an annular receptacle (eye) 20 for attachment to a crane (not shown here). A counterweight 22 that serves for compensation of the asymmetrical (due to the C-shape) weight distribution of the support unit 16 is attached on the load arm 18. The receptacle 20 is arranged above the center of gravity 24 of the support unit 16. The length of the support bar 14 is designed such that its center point 26 is situated below the center of gravity 24. When the support unit 16 is suspended by the crane, the support bar 14 is aligned level due to the counterweight 22. The gradient coil unit 6 is supported on the support bar 14 such that its center of gravity 28 is situated in a vertical line 30 with the center 26 of the support bar 14. The level position of the support bar 14 is also maintained with the gradient coil unit 6 supported thereon. Since the gradient coil unit 6 is supported on the support bar 14 such that it can move, the correct position thereof can be adjusted by simple displacement on the support bar 14. The possible directions of the displacement are indicated by a double arrow 32. Using the crane it is possible in a simple manner to exactly position the support bar 14 and the gradient coil unit 6 with regard to the basic field magnet 2.

Figure 4:
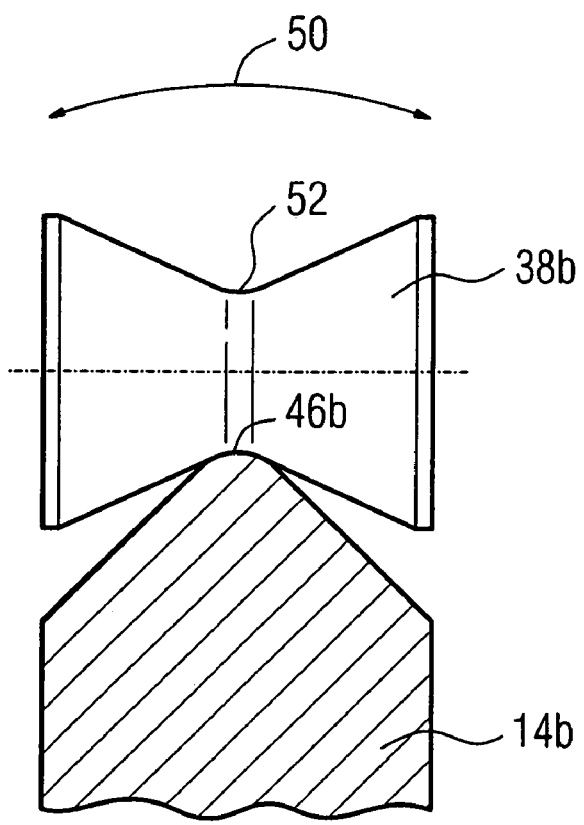
FIG. 4 shows an alternative embodiment of a roller and of a support bar.

In addition to the correct positioning within the basic field magnet 2, it is necessary to align the gradient coil unit 6 in a correct angular position with regard to its axis of symmetry 33. For basic alignment, the carrier units 12 are supported on rollers (not shown in FIG. 1). Two embodiments of the rollers are shown in FIGS. 3 and 4 and explained in further detail below. Weight elements 34 that are used for fine adjustment of the angular position and whose function is explained further using FIG. 2 are attached on both carrier units 12.

FIG. 2 shows an end section view of the magnetic resonance apparatus according to FIG. 1. Only a part of the basic field magnet 2 with the gradient coil unit 6 inserted into the opening 4 is thereby shown. Receptacle pockets 36 that are used for accommodating shim materials for correction of the magnetic field in the normal operation of the magnetic resonance apparatus are formed in the gradient coil unit 6. Corresponding receptacle pockets 36 are also provided in the carrier units 12. Metal carriers 10 that likewise proceed through the carrier units 12 located at both ends of the gradient coil unit 6 are placed through two of the receptacle pockets 36 in the mounting of the gradient coil unit 6. The metal carriers 10 are longer than the gradient coil unit 6. In this manner the gradient coil unit 6 is connected with the carrier units 12 in a detachable manner. Each carrier unit 12 has a roller 38 by means of which it can be supported and moved on the support bar 14. The properties of the roller 38 on the support bar 14 are explained in detail below using the exemplary embodiments shown in FIGS. 3 and 4. The embodiments of the roller 38 allows the gradient coil unit 6 to tilt in a limited range. The angular position of the gradient coil unit 6 can thereby be adjusted. The angular position of the gradient coil unit 6 can be monitored simply via a level 42 installed over the carrier unit 12. A fine adjustment can be effected via the movable weight elements for optimization of the angular position. By simple displacement of the weight elements 34 on a support rod 44, a technician can correct the angular position of the gradient coil unit 6 until the level 42 indicates the correct angular position. Due to the displacement of the weight elements 34, the center of gravity of the system made up of gradient coil unit 6 and the carrier units 12 shifts such that the system correspondingly aligns under the effect of gravity. The weight elements 34 can be fixed on the support rods 44 via locking screws (not shown) to maintain an alignment of the gradient coil unit 6. After the correct alignment of the gradient coil unit 6, cladding parts or shims are inserted into the gap 8 between the basic field magnet 2 and the gradient coil unit 6 such that the gradient coil unit 6 is fixed in its final position. Now only the metal carrier 10 must be removed from the receptacle pockets 36 of the gradient coil unit 6 and the carrier units 12 must be demounted. After removal of the support bar 14, the mounting of the gradient coil unit 6 within the basic field magnet 2 is concluded. The time expenditure relative to the laborious alignment of the gradient coil unit 6 by means of shims can be reduced by several hours.

FIG. 3 shows an embodiment of the support bar 14*a* and of the roller 38*a*. In this embodiment, the bar 14*a* has a planar support surface 46*a*. The roller 38*a* has the shape of a barrel, with taperings 48 of the cross-section at the ends. The contact surface between the roller 38*a* and the support bar 14*a* is thereby minimized and the roller 38*a* can be tilted in a limited range, as indicated by the double arrow 50. The gradient coil unit 6 also can be correspondingly tilted via the carrier unit 12 connected with the roller 38*a*.

FIG. 4 shows an alternative embodiment of the support bar 14*b* and of the roller 38*b*. Here the support bar 14*b* exhibits a tapering towards the support surface 46*b*. The roller 38*b* exhibits a central narrowing 52. In this embodiment as well, the roller 38*b* can be tilted analogous to the embodiment described in FIG. 3.

Although modifications and changes may be suggested by those skilled in the art, it is the intention of the inventors to embody within the patent warranted hereon all changes and modifications as reasonably and properly come within the scope of their contribution to the art.

We claim:

1. A device for installing a gradient coil unit into a magnetic resonance apparatus comprising:
    a C-shaped support unit having a first arm configured to be suspended above and outside of and moved relative to an opening of a magnetic resonance apparatus and a second arm configured to extend into the opening of the magnetic resonance apparatus and into an opening of a gradient coil unit;
    a carrier unit configured to carry the gradient coil unit relative to and into the opening of the magnetic resonance apparatus; and
    said carrier unit being mounted on said second arm of said support via a connector, said connector allowing tilting of said carrier unit, with said gradient coil carried thereby during installation into the magnetic resonance apparatus, relative to said second arm of said support unit.

2. The device according to claim 1 wherein said support unit has a longitudinal axis, and wherein said connector allows tilting of said carrier unit relative to an axis that is parallel to said longitudinal axis.

3. The device according claim 1 comprising weight elements displaceably mounted on respective supports attached to said carrier unit, allowing movement of the weight elements to respective positions at which the weight elements are then fixed in position on said carrier unit to angularly adjust said gradient coil.

4. The device according to claim 1 comprising a position monitoring unit on said carrier unit.

5. The device according to claim 4 wherein said position monitoring unit is a level.

6. The device according to claim 1 wherein said support unit comprises a support segment having a support surface on which said connector is movably disposed to permit said tilting of said carrier unit.

7. The device according to claim 6 wherein said tilting occurs in a tilting direction, and wherein said connector has a round cross-section perpendicular to said tilting direction.

8. The device according to claim 7 wherein said connector exhibits a central narrowing along an axis proceeding and perpendicular to said round cross-section, and wherein said support surface of said support segment exhibits a narrowing generally conforming to said narrowing of said round cross-section of said connector.

9. The device according to claim 7 wherein said connector exhibits a narrowings at opposite ends of said connector relative to an axis proceeding through and perpendicular to said round cross-section, and wherein said support surface of said support segment is planar.

10. The device according to claim 1 wherein said carrier unit has a plurality of receptacles therein, and comprising a plurality of carrier elements disposed in said receptacles, said carrier elements being adapted to engage and carry said gradient coil unit.

11. The device according to claim 1 wherein said support unit comprises a bearing segment on which said connector is disposed, and a load segment permanently connected to said support segment.

12. The device according to claim 11 wherein said support unit comprises a counterweight for said gradient coil unit permanently attached to said load segment.

13. A magnetic resonance apparatus comprising:
a magnetic resonance scanner having a hollow interior;
a gradient coil unit configured for insertion into said hollow interior of said magnetic resonance scanner; and
a device for installing said gradient coil unit into said hollow interior of said magnetic resonance scanner, said device comprising a C-shaped support unit having a first arm configured to be suspended above and outside of and moved relative to an opening of a magnetic resonance apparatus and a second arm configured to extend into the opening of the magnetic resonance apparatus, a carrier unit configured to carry a gradient coil unit, and said carrier unit being mounted on said second arm of said support via a connector, said connector allowing tilting of said carrier unit, with said gradient coil carried thereby, relative to said second arm of said support unit.

* * * * *